United States Patent [19]

Hosokawa

[11] Patent Number: 5,410,552
[45] Date of Patent: Apr. 25, 1995

[54] METHOD AND APPARATUS FOR GENERATING TEST SEQUENCE

[75] Inventor: Toshimori Hosokawa, Katano, Japan

[73] Assignee: Matsushita Electric Industrial Co., Ltd., Osaka, Japan

[21] Appl. No.: 37,244

[22] Filed: Mar. 26, 1993

[30] Foreign Application Priority Data

Mar. 27, 1992 [JP] Japan .................. 4-070757

[51] Int. Cl.$^6$ ............................. G06F 11/00
[52] U.S. Cl. ..................... 371/27; 371/22.1; 371/23
[58] Field of Search ............ 371/27, 22.1, 23

[56] References Cited

U.S. PATENT DOCUMENTS

| | | | |
|---|---|---|---|
| 4,204,633 | 5/1980 | Goel | 371/27 |
| 4,696,006 | 9/1987 | Kawai | 371/27 |
| 4,937,826 | 6/1990 | Gheewala et al. | 371/22.1 |
| 4,996,689 | 2/1991 | Samad | 371/27 |

OTHER PUBLICATIONS

Fault Tolerant Computing: Theory and Techniques, vol. I, Chapter1, 1.4.2, issued by Prentice-Hall, Englewood Cliff, N.J., 1986.
Hitec: A Test Generation Package for Sequential Circuits, by T. Niermann et al., as a refernece of European Design Automation Conference in 1991.

Primary Examiner—Emanuel T. Voeltz
Assistant Examiner—Hal D. Wachsman
Attorney, Agent, or Firm—Price, Gess & Ubell

[57] ABSTRACT

Disclosed is a method and apparatus for generating a test sequence to test a fault in a digital circuit. According to this method and apparatus, when a fault propagation process for a fault, for which a test sequence is generated is not successful, at least a segment of a path to propagate the effects of the fault is memorized as illegal information., And the fault propagation process is restarted for the same fault without selecting the illegal information. Hence, the chance of a successful fault propagation process is increased, which leads to the improvement of the fault coverage. In addition, according to the apparatus and method, it is detected whether a state transition goes into a loop (i.e., two identical states exist) in the state initialization process and then the process is restarted by defining the state caused the loop as an illegal state. Hence, the chance of a successful state initialization process is increased, which leads to the improvement of the fault coverage.

15 Claims, 18 Drawing Sheets

FIG. 1

Fault Table

| signal lines | faults | detection | processing | redundant faults |
|---|---|---|---|---|
| a | s-a-0 | 1 | 1 | 0 |
| a | s-a-1 | 0 | 1 | 1 |
| b | s-a-0 | 1 | 1 | 0 |
| b | s-a-1 | 1 | 1 | 0 |
| c | s-a-0 | 0 | 1 | 0 |
| c | s-a-1 | 0 | 0 | 0 |
| ⋮ | ⋮ | ⋮ | ⋮ | ⋮ |

S1  fault excitement state
S4  initial state

FIG. 10

| signal lines | faults | Illegal D frontiers |
|---|---|---|
| c | s-a-1 | output signal of FF3 |
| ⋮ | ⋮ | ⋮ |
| | | |

FIG. 14

Illegal sets

| signal lines | faults | D frontiers | Target PPO |
|---|---|---|---|
| a | s-a-1 | output signal of FF2 | input signal of FF3 |
| | | | |

FIG. 17

| states | FF1 | FF2 | - - - | FFn |
|--------|-----|-----|-------|-----|
| S1 | 0 | 0 | - - - | 0 |
| S2 | 1 | 1 | 1 | 1 |
| S3 | 1 | 1 | 1 | 1 |
| S4 | 1 | 1 | 1 | 1 |

(a)

Two S1s in the history
→ loop of state transition

Delete S1 from the history (b)

Justify the state of S3
with S1 as illegal state
(cut branch from S1 to S3)

(c)

METHOD AND APPARATUS FOR GENERATING TEST SEQUENCE

BACKGROUND OF THE INVENTION (1) Field of the Invention

This invention relates to a method and apparatus for generating a test sequence to test a fault in a digital circuit.

(2) Description of the Related Art

The adaption of LSI to a digital circuit has been remarkable these days, being utilized in every field. A technique of testing a fault in the LSI has been of great importance in accordance with the progress of the LSI since signals therein are not directly observable and controllable.

Various methods have been presented to automatically generate a test sequence for testing a fault in a digital circuit. Generally, the presence of a fault is checked by first inputting an appropriate input sequence to an input terminal of a circuit to be tested and then comparing the resulting output of an output terminal of the circuit with an expected output. This input sequence is the test sequence, which is generated to detect every presumed fault.

Conventional test sequence generation methods are disclosed, for example, in Chapter 1, 1.4.2 "Stuck at Fault Testing" of a reference book entitled "FAULT TOLERANT COMPUTING: THEORY AND TECHNIQUES", Volume I, issued by PRENTICE-HALL, Englewood Cliff, N.J. and "HITEC: A TEST GENERATION PACKAGE FOR SEQUENTIAL CIRCUITS" by T. Niermann and J. H. Patel, as a reference of European Design Automation Conference in 1991.

Such conventional test sequence generation method is detailed as follows:

A fault to be detected is a stuck-at fault, which is a model fault assumed based on a circuit to be tested. Such a fault causes a value of a signal lane in the circuit to be fixed to either a logical 0 or a logical 1, which are respectively referred to as "stuck-at-0 fault" and "stuck-at-1 fault". These stuck-at faults are previously registered on a fault table as shown in FIG. 1 based on the net list of the circuit. The table contains five columns: "signal lines" indicating all the signal lines in the circuit, "faults" indicating either stuck-at-0 fault (s-a-0) or stuck-at-1 fault (s-a-1), "detection" indicating successful detection or detectability by a test sequence for another fault by a 1, "process" indicating the completion of a test sequence generation process by a 1 (it does not matter whether the process is successful or not), and "redundant faults" indicating redundancy i.e. undetectability of a fault by a 1. For example, s-a-0 in the signal line "a" has been found not to be a redundant fault through the process and a test sequence has been successfully generated, on the other hand, s-a-1 in the signal line "c" has been found not to be a redundant fault and the generation of a test sequence has been unsuccessful.

This conventional test sequence generation method in a sequential circuit is flowcharted in FIG.

In the flowchart, the test sequence generation process starts at Step 401.

In Step 402, it is judged whether there is any fault except redundant faults for which a test sequence has not been generated yet (hereinafter referred to as undetected fault) and for which a test sequence generation process has not been performed yet (hereinafter referred to as unprocessed fault). If there is, then the system that executes this process proceeds to Step 403, and otherwise the system goes to Step 408 to terminate the process.

In Step 403, among undetected and unprocessed faults, one fault for which a test sequence is generated (hereinafter referred to as target fault) is selected, and at the same time, the corresponding row in the column "process" is made a 1.

In Step 404, a test pattern for a target fault is generated as a primary step for the test sequence generation, only for the combinational circuit to check whether the fault is a logically undetectable fault (hereinafter referred to as redundant fault). When the target fault is found to be a redundant fault or requires more time than allowed to generate a test sequence, the corresponding row in the column "redundant fault" is made a 1 and the system goes back to Step 402. In Step 404, such an undetectable fault is excluded before the test sequence generation.

In step 405, a test sequence for the target fault selected in Step 403 is generated to propagate the effects of the target fault from the fault site to any external output pin (hereinafter referred to as fault propagation process). If the fault propagation process is successful, then the system proceeds to Step 406, and otherwise the system goes back to Step 402 to process the next target fault.

In Step 406, a test sequence is generated to transfer the initial state of the circuit to a state appeared when the fault propagation process has been just completed (hereinafter referred to as state initialization process). If the process is successful, then the system proceeds to Step 407, and otherwise the system goes back to Step 402 to process the next target fault. The initial state may be any state; however, in general, as long as all the flip-flops (hereinafter referred to as FFs) in the circuit to be tested are either in "don't care" state or unknown state, a test sequence by which a fault test can be performed in whatever state the sequential circuit may be can be obtained. Actually, when the circuit is in a state appeared when an immediately preceding fault test has been just completed, the time required for consecutive fault tests can be shortened.

In Step 407, a fault simulation is performed with the test sequence of the target fault selected in Step 403 and the corresponding row in the column "detection" is made a 1. More than one target fault may be detected because all the faults in the common path are simulated simultaneously.

In Step 408, the test sequence generation process terminates.

The fault propagation process of Step 405, which is based on Reverse Time Processing (RTP), is flowcharted in .FIG. 3. According to RTP, a sequential circuit logically consisting of a combinational circuit and FFs is treated as a series of combinational circuits iterated in time sequence that are still logically equal to the sequential circuit. In the series of circuits, a path extending from an external output to be the goal of the target fault up to the fault site is heuristically determined and traced backward, and then an input sequence for the fault signal to be propagated along the path is found by the fault propagation process. In this process, an input for the fault signal of the target fault to propagate is found at each iterated combinational circuit (hereinafter referred to as time frame), that is, the path is activated.

More precisely, the following steps are executed in each time frame as shown in FIG. 3: In the flowchart, the fault propagation processing starts at Step 601.

In Step 602, it is judged whether a path including a target fault has been sensitized or not. If it has, then the fault propagation process is regarded as a success. The system goes to Step 605, and otherwise it proceeds to Step 603.

In Step 603, the target fault site or one of the outputs of the FFs corresponding to the inputs of the combinational circuit is selected as a D-frontier. Then, the D-frontier is assigned a fault signal and then the fault signal is propagated to either any external output pin or to the input of the D-frontier selected in an immediately preceding time frame (hereinafter referred to as target PPO) by assigning input values and state values respectively to the external input pins and the outputs of the FFs. If the fault propagation process is successful, then the system goes to Step 604, and otherwise it goes to Step 605.

In Step 604, the state values thus assigned to the external input pins to sensitize the fault propagation path are memorized as a test sequence, the system going to Step 602 with the input of an FF whose output is the D-frontier as a new target PPO.

In Step 605, the fault propagation process terminates.

The state initialization process of Step 406 is flowcharted in FIG. 4. In this process, an input sequence is generated based on state values assigned so that the state transition starts from a state appeared when the fault propagation process has been just completed (hereinafter referred to as fault excitement state), tracing backward to the initial state, contrary to the state transition in an actual fault test.

In FIG. 4, the state initialization process starts at Step 501.

In Step 502, it is judged whether the current state of the circuit coincides with its initial state or not. If they are coincident, then the system goes to Step 505 to terminate the process, and otherwise the system proceeds to Step 503.

In Step 503, the current state is justified by assigning state values to the outputs of the external input pins and of the FFs. If the justification is successful, then the system proceeds to Step 504, and otherwise it goes to Step 505 to terminate the process.

In Step 504, the state values thus assigned to the external input pins are memorized as a test sequence, whereas the state values assigned to the outputs of the FFs, that is, the state values that have justified the current state are defined as the current state. Then the system goes back to Step 502.

In Step 505, the state initialization process terminates.

The operation of the test sequence generation having the above-mentioned construction is described as follows:

First, a target fault is selected among undetected and unprocessed faults shown in the fault table in FIG. 1 (Steps 401–403 in FIG. 2).

Then, a test pattern for the combinational circuit in a circuit to be tested is generated to check whether the selected target fault is a redundant fault or requires extra time for the process. The circuit to be tested is illustrated in FIG. 5(*a*) and its simplified diagram is shown in FIG. 5 (*b*). Since the circuit can be logically divided into a combinational circuit and FFs, it is considered that the inputs of the combinational circuit consist of external input pins, which are primary inputs (hereinafter referred to as PIs) and pseudo primary inputs (hereinafter referred to as PPIs) outputted from the FFs, whereas the outputs of the combinational circuit consist of the external output pins, which are primary outputs (hereinafter referred to as POs) and pseudo primary outputs inputted to the FFs (hereinafter referred to as PPOs).

A test pattern for the combinational circuit is generated by assigning each appropriate input value by utilizing the PIs and PPIs of the inputs as well as the POs and PPOs of the outputs of the combinational circuit, so that the fault signal of a target fault is propagated to any output in Step 404. As a result, when the test pattern generation is successful, the system proceeds to Step 405, whereas if the target fault is a redundant fault, a 1 is set in the column of the "redundant fault" in the fault table, and the system goes back to Step 402 to select the next target fault.

In Step 405, a fault propagation process is executed to generate a test sequence for the target fault as shown in FIG. 6. The drawing contains three time frames 701, 702, and 703 in the sequential circuit, which are processed first, second, and third respectively. These time frames correspond to the combinational circuit expanded according to the state transition of the FFs separated from the combinational circuit. (For reference, the circuit of FIG. 5(*b*) is expanded and shown in FIG. 7).

Although only three time frames are shown in FIG. 6 for convenience, rather numerous time frames are required in an actual LSI. It should be noted that the fault propagation process proceeds reversely from the time frame 701 up to the time from 703 against the actual operation of a sequential circuit. FIG. 6 further contains an external output pin 704 of the sequential circuit, a propagation path 705 of a fault signal in the time frame 701, another fault propagation path 706 in the time frame 702, FFs 707–709 used in the time frame 701, FFs 710–712 used in the time frame 702, and a fault site 713 for the target fault "a".

The fault propagation process flowcharted in FIG. 3 is detailed as follows with reference to FIG. 6: In the first time frame 701, the target fault 713 can not be sensitized due to being unreachable to POs combinationally (Step 602 in FIG. 3), so that the output of FF3 (709) is heuristically selected as a D-frontier. The fault propagation path 705 is sensitized to assign a fault signal to FF3 (709) and propagate it to the external output pin 704. In other words, state values are assigned to the external input pins and the FFs to sensitize the path leading from FF3 (709) up to the external output pin 704 (Step 603). The state values successfully assigned are memorized as a test sequence, and the input of FF3 whose input is the D-frontier, is set as a new target PPO. Then the system goes back to Step 602 (Step 604). Since the target fault has not been sensitized yet at this point, the system proceeds to Step 603 (Step 602).

In the next time frame 702, the output of FF3 (709) selected as a D-frontier in the time frame 701 is made a target PPO, and FF2 (711) is heuristically selected as a D-frontier. Then FF2 (711) is assigned a fault signal and the fault signal is propagated to the input of FF3 (709) as a target PPO by sensitizing the fault propagation path 706 (Step 603). The successfully assigned state value is memorized as a test sequence, and the input of FF2 is set as a new target PPO (Step 604).

In the next time frame 703, the output of FF2 (711) is selected in the time frame 702 as a D-frontier is made a target PPO. It is assumed that a fault signal can not be propagated to the input of FF2 (711) as the target PPO whichever D-frontier is selected (Step 603). Since the fault propagation process for the fault 713 is thus unsuccessful, the fault propagation process terminates (Step 604). Subsequently, the system goes back to Step 402 in FIG. 2 (Step 405) to select the next target fault and to repeat the same process (Steps 402-405).

On the other hand, when the fault signal is successfully propagated to the target fault 713 in the time frame 703, the state values assigned to the external input pins in each time frame are generated as a test sequence. However, the state of each FF is in the fault excitement state (In the above case, it corresponds to the state value successfully assigned in the time frame 703), so that the test sequence thus generated is only effective to the fault excitement state. Therefore, finding a sequence to transfer the initial state of the circuit to its fault excitement state is required. This is the state initialization process.

The operation of the state initialization process is described as follows with reference FIG. 8.

In the drawing, numerals 801-804 depict each state of the circuit, 801 representing a fault excitement state, 804 representing an initial state. Branches 805-808 depict the possibility of transitions respectively from state 802 to state 801, from state 803 to state 802, from state 801 to state 803, and from state 804 to state 803.

At the point of the completion of the fault propagation process, the current state is the state 801 (S1), which does not coincide with the initial state (Step 502 in FIG. 4). Therefore, the current state is justified, that is, the states of the external inputs and of the FFs are assigned so that the current state can be transferred. Here, it is assumed that the assignment of the state 802 (S2) to the FFs is justified (Step 503). The justified state is treated as a new current state (S2) (Step 504).

The current state is justified in the same manner and the state S3 is made a new current state (Steps 502-504).

In the justification of the current state S3, the current state S3 may be transferred from either one of the states S1 and S4. When the justified state is the state S4, the state initialization is successful. In this case, a fault test sequence can be obtained by combining an input sequence obtained in the previous fault propagation process and another input sequence assigned in the state initialization process.

On the contrary, when the justified state is the state S1, the state initialization is unsuccessfully repeated, going into a loop of a state transition, never obtaining the initial state.

After the state initialization process is performed, a fault simulation is executed for the target fault with the use of the obtained test sequence. After having confirmed that the target fault is detectable by the external output pins, the corresponding row in the column "detection" is made a 1 (Step 407 in FIG. 2). Then the system goes back to Step 402. The foregoing behavior is further repeated to execute the test sequence generation process for every target fault.

Finally, the test sequence generation process in the circuit in FIG. 7 is described as follows. The "X" marks on the signal lines represent target faults.

A First Time Frame in the Propagation Process

It is assumed that since the sensitization of a path containing a target fault with "X" mark has not been completed (Step 602 in FIG. 3), an output Y2 of FF2 is selected as a D-frontier (the former half of Step 603). In the combinational circuit, state values to sensitize the path between an input signal y2 and an external output pin 0 are assigned as follows:

Two inputs (I, y2) of an AND gate G2 must be (1, D) for a fault signal D to be outputted to the external output pin 0. In this case, an input y1 may be don't care. Accordingly, a state value (I, y1, y2)=(1, X, D) is assigned (the latter half of Step 603). This state value (I, X, D) is memorized as part of the test sequence and the input y2 of FF2 (Step 604) is made a new target PPO.

A Second Time Frame in the Propagation Process

It is assumed that a target fault with a "X" mark has been selected as a D-frontier (Step 602 and the former half of Step 603). In the combinational circuit, state values to sensitize a path between the target fault and Y2 of the target PPO are assigned as follows:

Two inputs of an OR gate G3 (the output of G1, y1) must be (D, 0) for the fault signal D to be outputted to Y2, and in addition, two inputs of the AND gate G1 (I, target fault) must be (1, D). Therefore, a state value (I, y1, y2)=(1, 0, 0) is assigned (the latter half of Step 603).

This state value (1, 0, 0) is memorized as part of the test sequence and an input y1 of FF1 (Step 604) is made a new target PPO. However, since the target fault has been sensitized (Step 602), the propagation process terminates (Step 605).

State Initialization Process

In sequence, a state initialization process is performed. If it is assumed that the initial state is (FF1, FF2)=(0, 0), then the state initialization process immediately terminates (Steps 502 and 505 in FIG. 4).

The following is a description of a case where the initial state is (FF1, FF2)=(X, X), that is, don't care. Since the initial state (X, X) and the current state (0, 0) do not coincide with each other (Step 502), a state value to justify the current state is assigned.

In order to justify FF1 (Y1=0), the two inputs of the AND gate G1 (I, y2) should be (0, X) and to justify FF2 (Y2=0), the two inputs of OR gate G3 (the output of G1, y1) should be (0, 0). In this case, y2 should be X. Therefore, assigning I=0 as the input value justifies the state (0, 0) (Step 503).

This input value I=0 is memorized as part of the test sequence and the justified state (0, X) is made the current state (Step 504). Since it does not coincide with the initial state (Step 502), the current state is justified.

In order to justify FF1 (Y1=0), two inputs of AND gate G1 (I, y1) should be (0,X) and to justify FF2 (Y2=0), the two inputs of the OR gate G3 (the output of G1, y1) should be (0, X). In this case, y1 should be X, so that assigning I=0 as the input value justifies the state (0, X) (Step 503).

This input value I=0 is memorized as part of the test sequence and the justified state (X, X) is made the current state (Step 504). Since it coincides with the initial state (Step 502), the justification process terminates (Step 505).

Consequently, a sequence {0011} is obtained, which should be inputted to the input signal I.

However, according to the test sequence generation method thus described, many faults remain undetected for lack of any established strategy for unsuccessful fault propagation processes or state initialization processes.

SUMMARY OF THE INVENTION

In view of the foregoing circumstances, a first object of this invention is to provide a method and apparatus for generating an test sequence having high fault coverage by improving the chance of a successful fault propagation process.

A second object of this invention is to provide a method and apparatus for generating a test sequence having high fault coverage by improving the chance of a successful state initialization process.

The first object can be achieved by a method for generating a test sequence to test an assumed stuck-at fault in a sequential circuit expanded as a series of time frames, comprising the steps of tracing backward in the time frames to propagate a fault signal of the stuck-at fault along a path selected in a time frame and assigning an input value in the time frame in order to sensitize the path, the backtrace operation starting from a first time frame, which contains an output pin to be the goal of the stuck-at fault up to a time frame containing the fault site; defining, when a path unsuccessfully sensitized in a time frame is detected, at least a segment of the path as illegal information, the path extending between the first time frame and the time frame where the path is detected to have been unsuccessfully sensitized; and restarting another backtrace operation without selecting the segment defined as illegal information.

The illegal information may be a D-frontier indicating a signal line selected in a specified time frame, the signal line being the goal of a fault signal propagated from an immediately preceding time frame.

The specified time frame may be a time frame in which a fault propagation path is sensitized first.

The illegal information may be a set of a D-frontier and a target PPO, the set indicating a propagation path in a specified time frame.

The illegal information may be a set of a D-frontier and a target PPO, the set indicating a propagation path in a time frame immediately before the time frame where the propagation has been unsuccessful.

The method of the first object can be achieved also by a method for generating a test sequence to test an assumed stuck-at fault in a sequential circuit expanded as a series of time frames, comprising a first step of counting the number of fault propagation processes executed for every target fault, for which a test sequence is generated and a second step of judging whether the number counted is beyond a predetermined number and then terminating the test sequence generation if it is, wherein the first step comprising: a first sub step of selecting one target fault among one of target faults for which the fault propagation processes have not been executed yet and other target faults for which the fault propagation processes are regarded to have not been executed yet, and for which test sequences have not generated yet; a second sub step of, when a D-frontier indicating an input of a path to be sensitized is already registered as an illegal frontier, selecting a D-frontier other than the illegal frontier in a time frame where a target fault is propagated to an external output pin in order to execute fault propagation process; a third sub step of judging whether the fault propagation in the second step is successful or not; a fourth sub step of, when the fault propagation is judged to be unsuccessful, registering the D-frontier selected in a time frame where the effects of the target fault is propagated to an external output pin as the illegal D-frontier of the target fault; and a fifth sub step of, when the first through third sub steps have been executed for all the target faults, regarding faults for which the fault propagation processes have been unsuccessfully executed as faults for which fault propagation processes have not been executed yet.

The second object can be achieved by a method for generating a test sequence through a state initialization process wherein input signals values to be inputted to the external input pins of a sequential circuit to be tested are found in order to transfer the state of the circuit from its initial state to a state appeared when a fault propagation process for a stuck-at fault has been just completed, comprising the steps of: in order to justify the current state of the sequential circuit, assigning the outputs of memory elements and the input signal values to be given to the external input pins, the assignment operation being processed to obtain its initial state starting from a state appeared when the fault propagation process has been just completed; judging whether the state thus assigned coincides with one of a state appeared when the fault propagation process has been just completed and a state assigned before; and restarting, when the two states are judged to be coincident with each other, the assignment operation while cancelling at least the latest state of those assigned so far.

The restarting step may start the assignment operation from a state appeared when the fault propagation process has been just completed.

The restarting step may start the assignment operation from a state immediately before the coincident state.

The apparatus of the first object can be achieved by an apparatus for generating a test sequence to test an assumed stuck-at fault in a sequential circuit expanded as a series of time frames, comprising a backtrace device for tracing backward in the time frames to propagate a fault signal of the stuck-at fault along a path selected in a time frame, wherein an input value in the time frame is assigned in order to sensitize the path and the backtrace operation starts from a first time frame, which contains an output pin to be the goal of the stuck-at fault up to a time frame containing the fault site; a defining device for, when a path unsuccessfully sensitized in a time frame is detected, defining at least a segment of the path as illegal information, the path extending between the first time frame and the time frame where the path is detected to have been unsuccessfully sensitized; a memorizing device for memorizing the illegal information correspondingly with the fault signal; and a prohibiting device for prohibiting to select a path defined as illegal information to drive the backtrace device for another fault.

The illegal information may be a D-frontier indicating a signal line selected in a specified time frame, the signal line being the goal of a fault signal propagated from an immediately preceding time frame.

The specified time frame may be a time frame in which a fault propagation path is sensitized first.

The illegal information may be a set of a D-frontier and a target PPO, the set indicating a propagation path in a specified time frame.

The illegal information may be a set of a D-frontier and a target PPO, the set indicating a propagation path in a time frame immediately before the time frame where the propagation has been unsuccessful.

The second object can be achieved by an apparatus for generating a test sequence through a state initialization process wherein input signal values to be inputted to the external input pins of a sequential circuit to be tested are found in order to transfer the state of the circuit from its initial state to a state appeared when a fault propagation process for a stuck-at fault has been just completed, comprising: an assigning device for, in order to justify the current state of the sequential circuit, assigning the outputs of memory elements and the input signal to be given to the external input pins, the assignment operation being processed to obtain its initial state starting from a state appeared when the fault propagation process has been just completed; a judging device for judging whether the state thus assigned coincides with one of a state appeared when the fault propagation process has been just completed and a state assigned before; and a restarting device for restarting, when the two states are judged to be coincident with each other, the assignment operation while cancelling at least the latest state of those assigned so far.

The restarting device may start the assignment operation from a state appeared when the fault propagation process has been just completed.

The restarting device may start the assignment operation from a state immediately before the coincident state.

According to the apparatus and method having the above-mentioned construction, when a fault propagation process for a target fault is unsuccessful, at least a segment of a path to propagate the effects of the target fault is memorized as illegal information. And the fault propagation process is restarted for the same target fault without selecting the illegal information. Hence, the chance of a successful fault propagation process is increased, which leads to the improvement of the fault coverage.

In addition, according to the apparatus and method having the above-mentioned construction, it is detected whether a state transition goes into a loop (i.e., two identical states exist) in the state initialization process and then the process is restarted by defining the state caused the loop as an illegal state. Hence, the chance of a successful state initialization process is increased, which leads to the improvement of the fault coverage.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings:

FIG. 1 is a sample fault table for a circuit to be tested.

FIG. 10 is a table showing a group of illegal D-frontiers in the same embodiment.

FIG. 14 is a table showing a group of illegal combination in the same embodiment.

FIG. 17 is a history of state transitions of the same embodiment.

DESCRIPTION OF THE PREFERRED EMBODIMENTS

Embodiment 1

Figure 9:
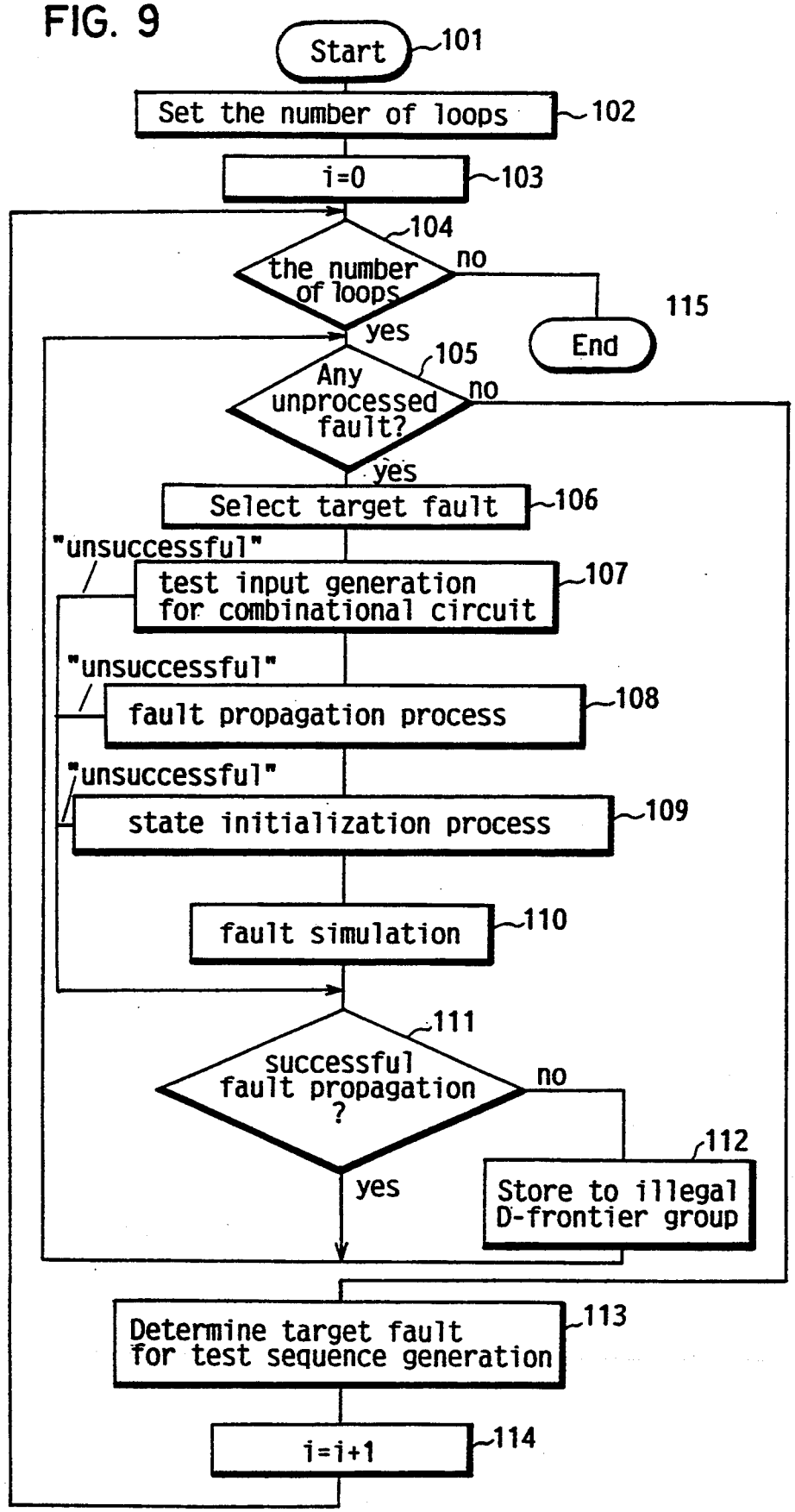
FIG. 9 is a flowchart of the test sequence generation method for a sequential circuit according to Embodiment 1 of this invention.

The test sequence generation method according to this embodiment is flowcharted in FIG. 9.

Faults to be tested with the use of this test sequence are the same as those described in the Related Arts, and are previously registered in a fault table as shown in FIG. 1 for each signal line, based on the net list of the LSI to be tested.

In FIG. 9, the test sequence generation process starts at Step 101.

In Step 102, the maximum number of the process to be executed for undetected faults on the fault table is set. The number is determined by considering the complexity or size of a circuit to be tested, or a time allowed for the process. In most cases, 5 times is reasonable.

In Step 103, the number of the process is initialized to zero.

In Step 104, it is judged whether the process has reached the maximum number set in Step 102. If it has not, then the system proceeds to Step 105, and otherwise the system goes to Step 115.

In Step 105, it is judged whether there is any undetected and unprocessed fault except redundant faults on the fault table. If there is, then the system proceeds to Step 106, and otherwise it goes to Step 113.

In Step 106, one target fault is selected among the undetected and unprocessed faults.

Figure 2:
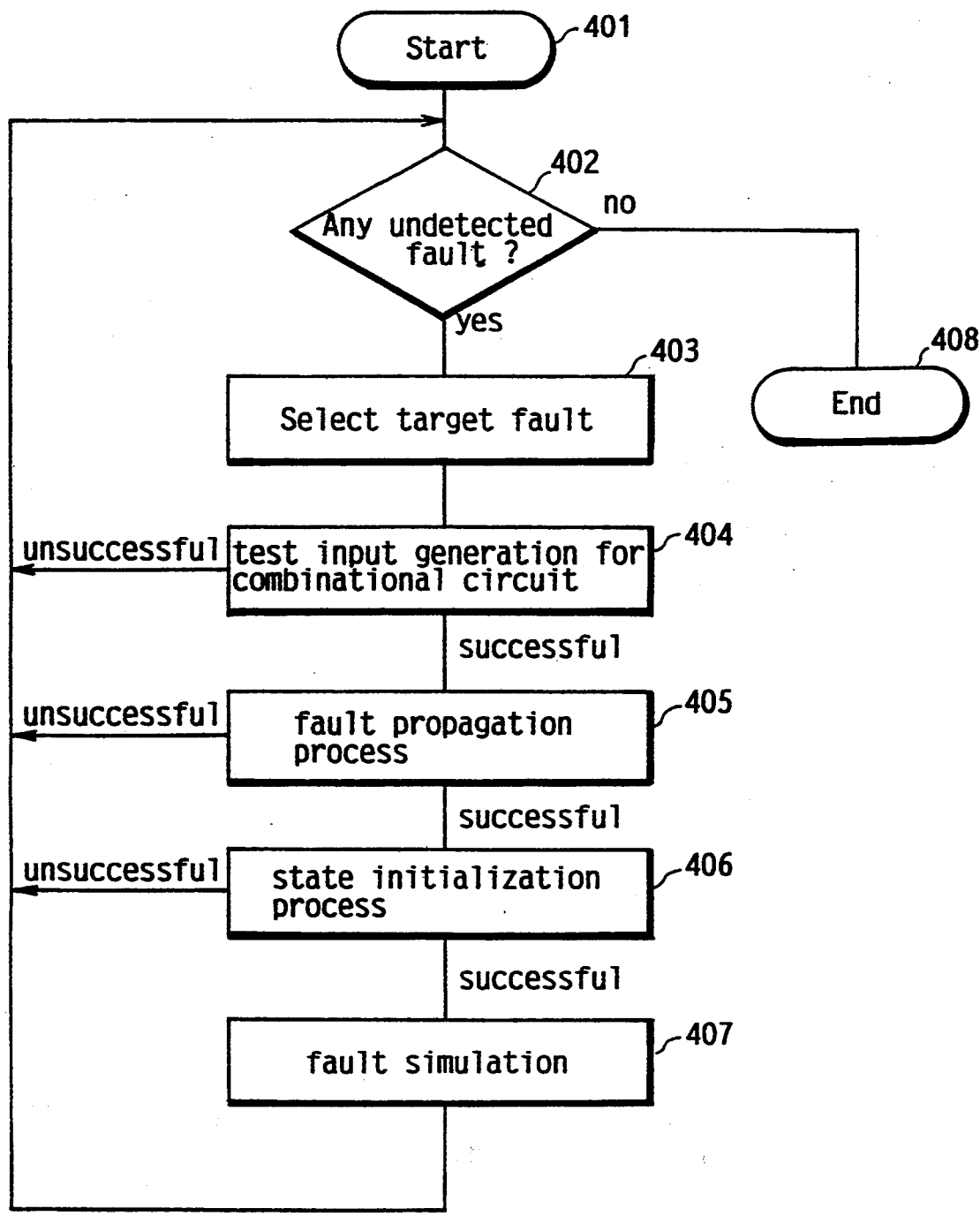
FIG. 2 is a flowchart of a conventional test sequence generation method for a sequential circuit.

In Step 107, a test pattern for the selected fault is generated, as a preparatory step for the test sequence generation, only for the combinational circuit to check whether it is an undetectable fault or not. The steps 106 and 107 respectively correspond to Steps 403 and 404 in FIG. 2 depicting the related art.

In Step 108, a fault propagation process is performed for the selected target fault.

In Steps 109 and 110, a state initialization process and a fault simulation process are respectively performed. These steps correspond to Steps 406 and 407 in FIG. 2.

In Step 111, it is judged whether the fault propagation process performed in Step 107 is successful or not. If it is, then the system goes back to Step 105, and otherwise the system proceeds to Step 112.

In Step 112, a D-frontier selected in a time frame where the effects of the target fault is propagated to any external output pin is registered to an illegal D-frontier group shown in FIG. 10. The figure contains three columns: "signal lines" indicating target fault sites to be detected, "faults" indicating types of the faults, and "D-frontiers" indicating D-frontiers prohibited to select. In this embodiment, the illegal D-frontiers are registered for each fault.

In Step 113, undetected faults on the fault table except redundancy faults are treated as unprocessed faults. In other words, faults corresponding to "0" in the column "detection" and to other than "1" in the column "redundant faults" are made "0" in the column of "process". Accordingly, faults for which a test sequence generation has been unsuccessful are selected again in Step 106.

In Step 114, the system counts up the number of the test sequence generation process for undetected faults by 1.

In Step 115, the test sequence generation process terminates.

Figure 11:
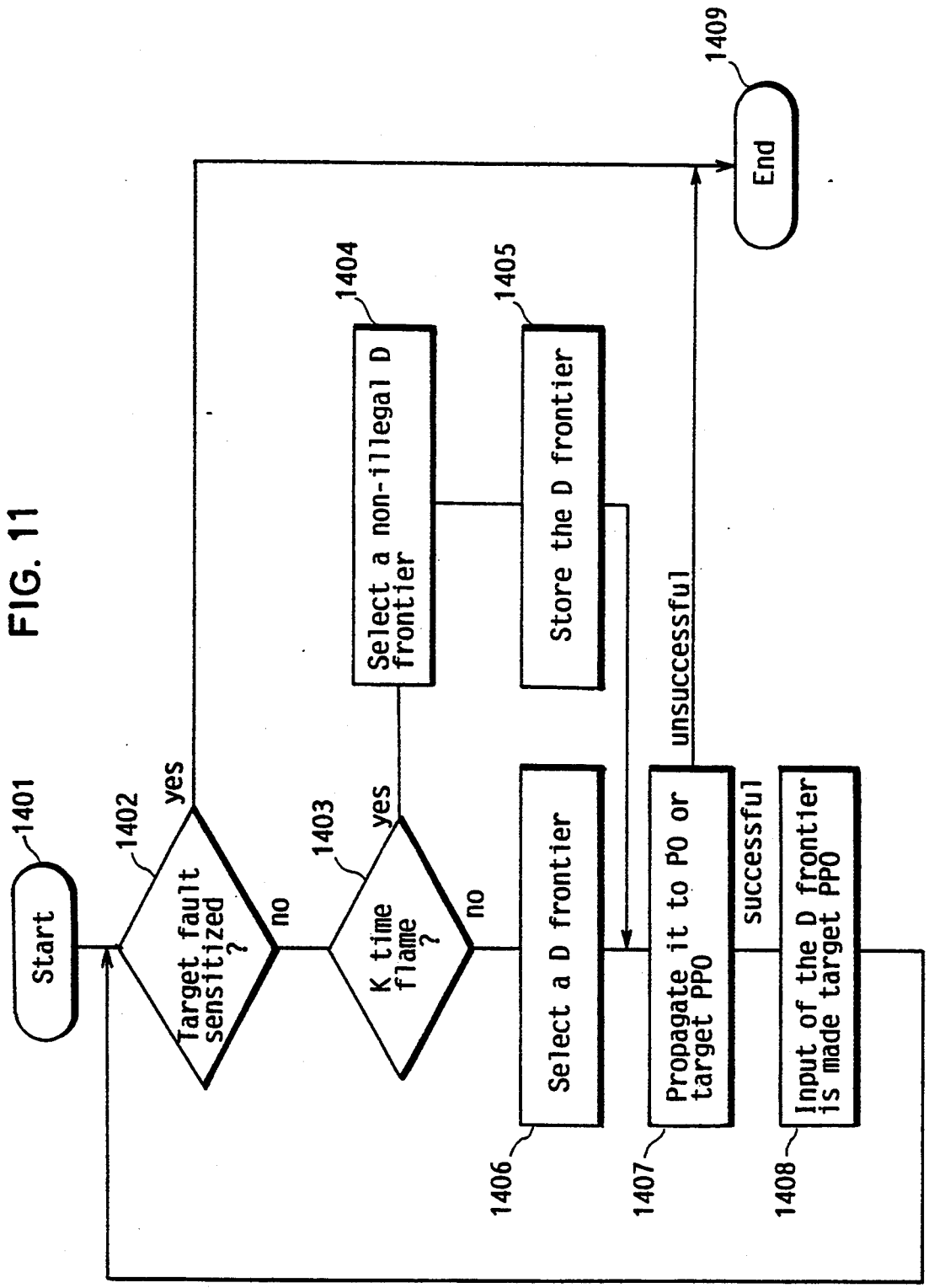
FIG. 11 is a flowchart of the fault propagation process in the same embodiment.

The fault propagation process of Step 108 is detailed in the flowchart in FIG. 11.

The flowchart contains additional Steps 1403–1405, according to which, faults registered in the illegal D-frontier group are excluded from the selecting objects of a D-frontier in No. k time frame. Accordingly, a D-frontier other than those detected not to have been successfully propagated before is selected in No. k time frame in on and after the second fault propagation process.

In Step 1402, it is judged whether a path including a target fault has been sensitized or not. If it has, then the process is successful and the system goes to Step 1409 to terminate the process, and otherwise the system proceeds to Step 1403.

In Step 1403, it is judged whether a time frame to be processed is k(=1st in this embodiment) time frame or not. If it is, then the system proceeds to Step 1404, and otherwise, the system goes to Step 1406.

In Step 1404, the target fault site or one of the outputs of FFs (i.e. the inputs of the combinational circuit) is selected as a D-frontier. In the selection, the illegal D-frontier group is referred to so as to avoid selecting those registered as illegal D-frontiers for the corresponding fault.

In Step 1405, the selected D-frontier is temporarily stored.

Figure 3:
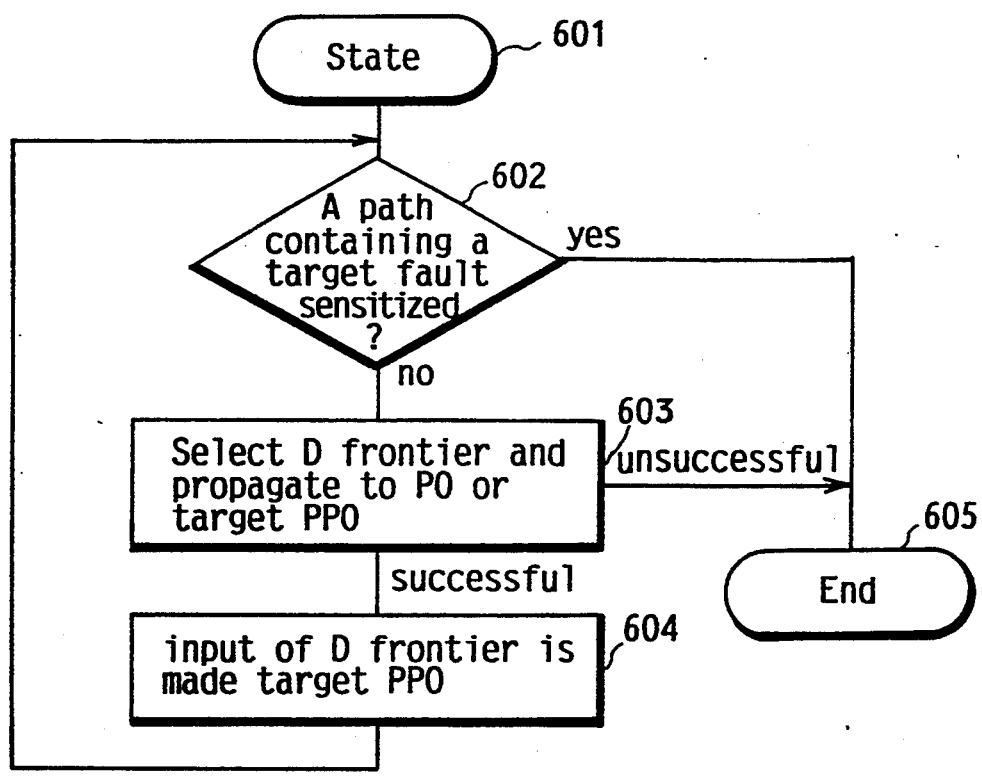
FIG. 3 is a flowchart of the fault propagation process in the method of FIG. 2 based on Reverse Time Process method.
Figure 4:
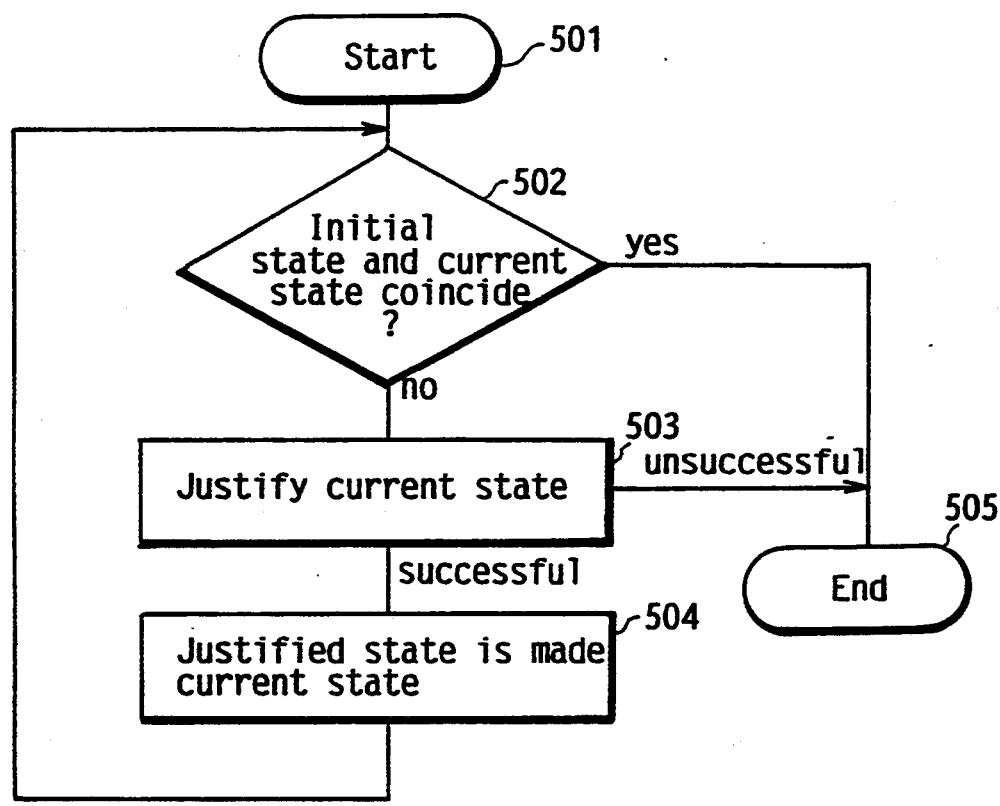
FIG. 4 is a flowchart of the state initialization process in the method of, FIG. 2.
Figure 5A:
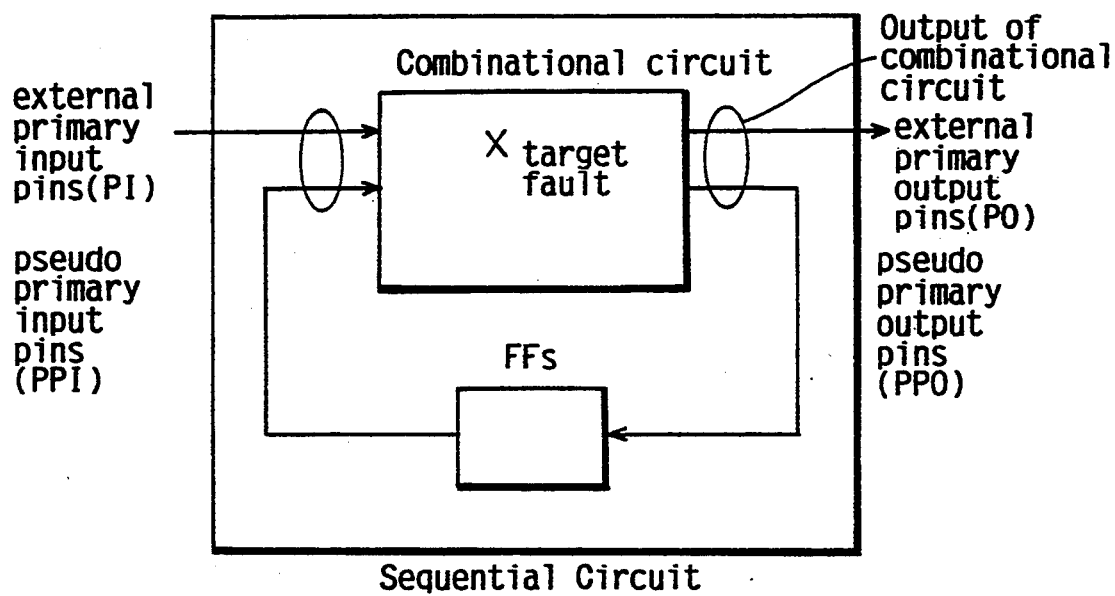
FIG. 5 (a) shows a combinational circuit and flip-flops in the sequential circuit, and FIG. 5 (b) is the simplified diagram.
Figure 5B:
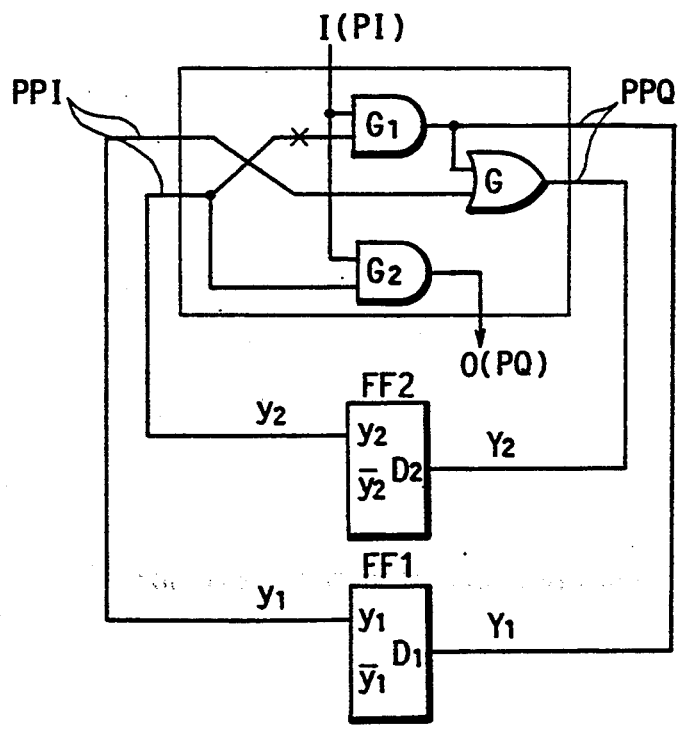

In Step 1406, the target fault site or one of the outputs of the FFs is selected as a D-frontier in the same manner as in Step 603 in FIG. 3.

In Step 1407, a fault signal is assigned to the selected D-frontier in a time frame to be tested, input values and state values are assigned respectively to the external input pins and the outputs of the FFs in order to propagate the fault signal to target PPO (that is, in order to sensitize the fault propagation path). If the fault propagation is successful, then the system proceeds to Step 1408, and otherwise it goes to Step 1409 to terminate the process. Such path sensitization is the same as the latter half of Step 602 in FIG. 3.

In Step 1408, the input values assigned to the external input pins in Step 1407 are memorized as a part of a test sequence and the system goes back to Step 1402 with the input of D-frontier as a new target PPO.

Figure 6:
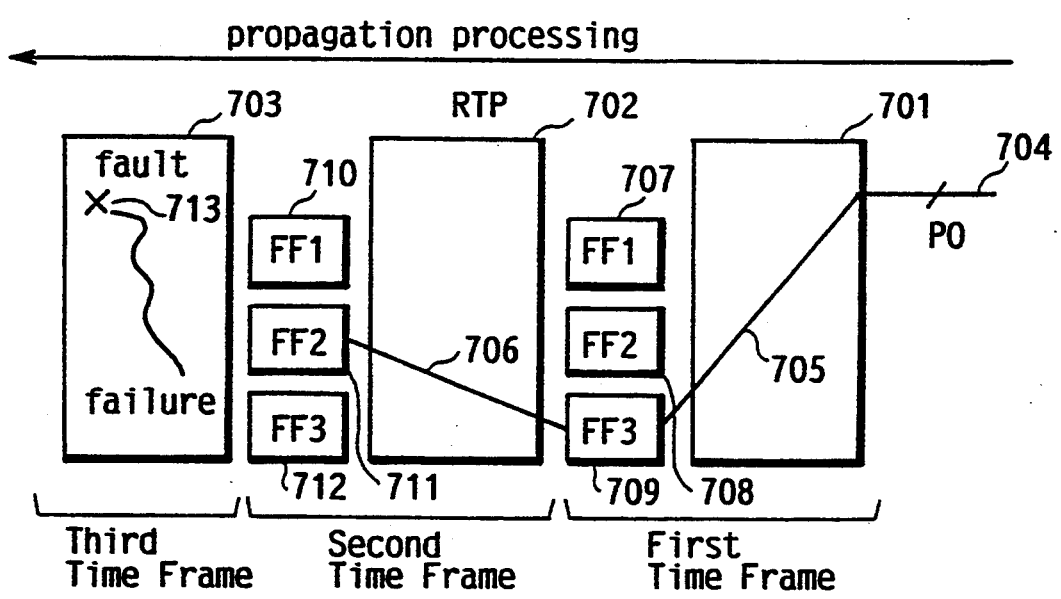
FIG. 6 is an operational illustration of the fault propagation process in the method of FIG. 2.
Figure 7:
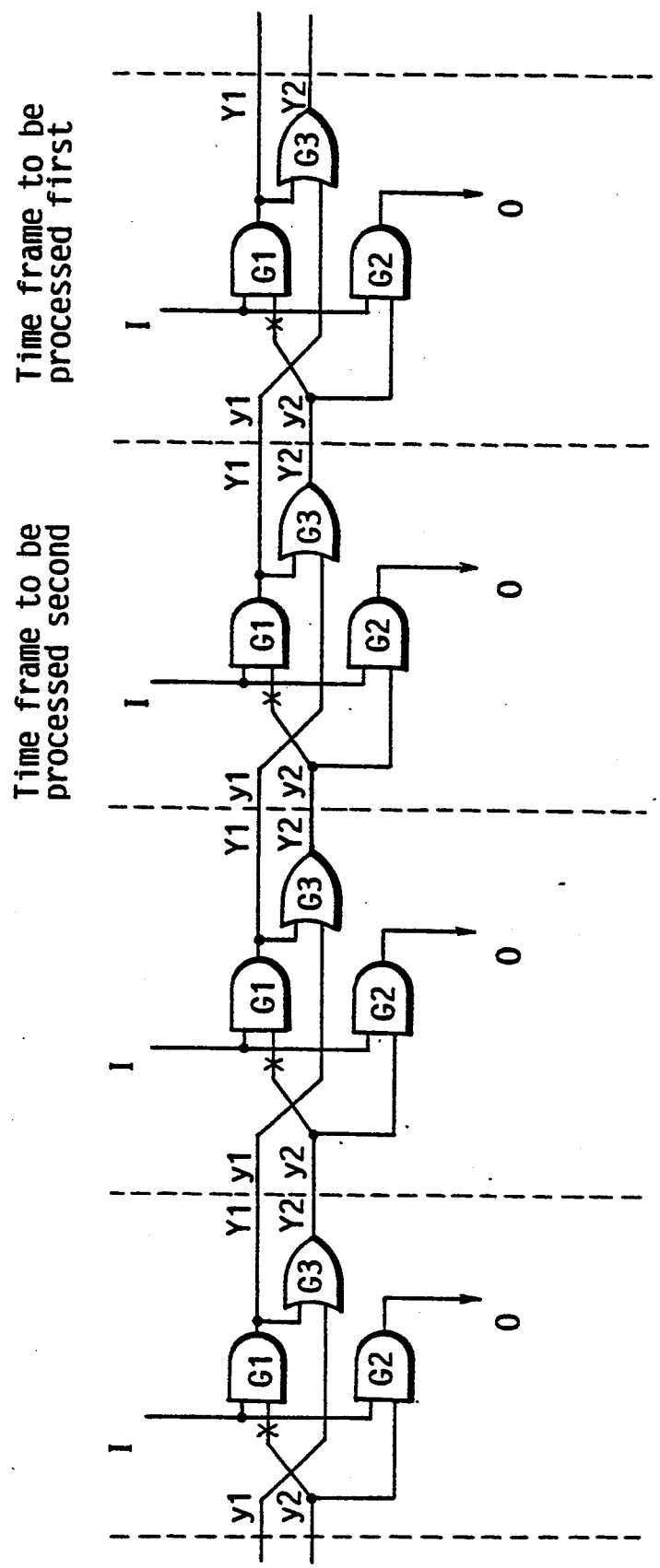
FIG. 7 is an example of a test sequence generation in the circuit shown in FIG. 5 (b).
Figure 12:
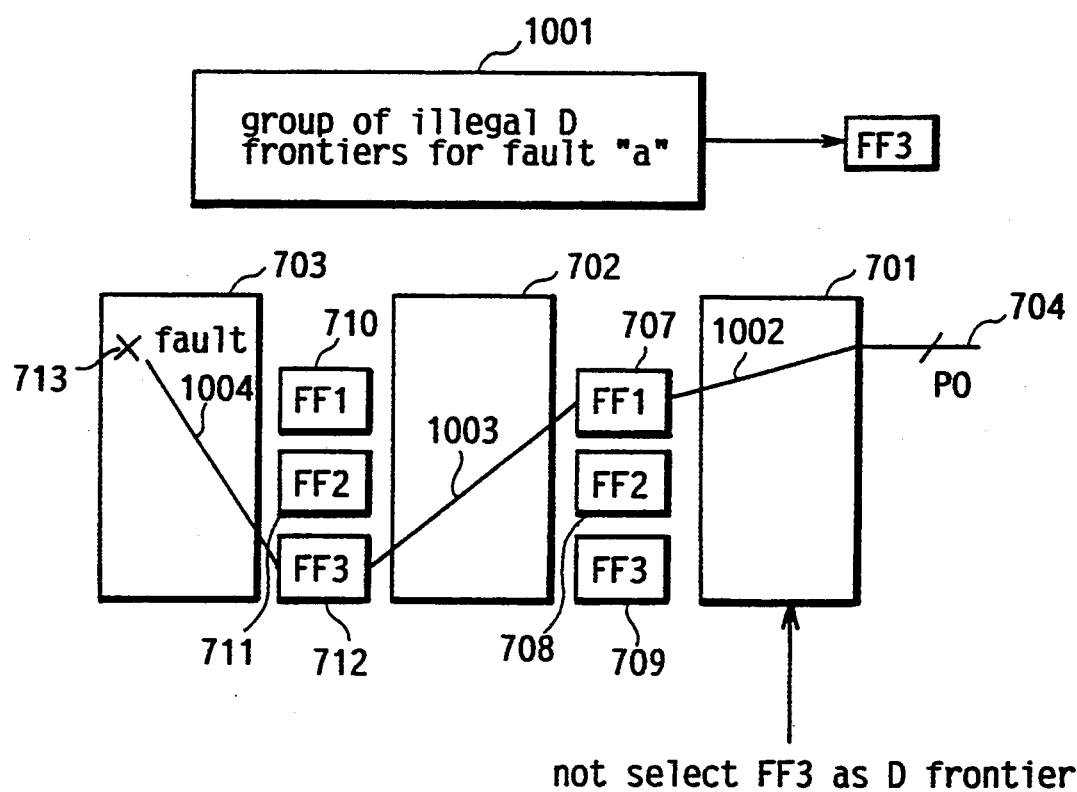
FIG. 12 is an operational illustration of the fault propagation process in the same embodiment.

The operation of the foregoing test sequence generation of this embodiment is described as follows with reference to FIG. 12 where like components are labeled with like reference numerals with respect to FIG. 6. Numeral 1001 represents the illegal D-frontier group for a target fault 713, and 1002–1004 are fault propagation paths respectively of time frames 701–703 in the second propagation process.

First, the maximum number of the fault propagation process is set to 5 in this embodiment (Step 102 in FIG. 9) and a variable i for controlling the number is initialized to zero (Step 103). Then, it is judged whether the variable i has reached the maximum number. If it has, then the system goes to Step 115 to end the process, and otherwise it proceeds to Step 105 (Step 104).

The subsequent steps 105–107 are the same as Steps 402–404 in FIG. 2, so that the description is omitted.

If a test pattern is successfully generated in Step 107, a fault propagation process is executed to generate a test sequence for the target fault (Step 108).

In a first (i=0) fault propagating process, it is assumed that the process is executed for the target fault 713 as described with reference to FIG. 6. The differences in the operation only are explained as follows:

In a first time frame (Step 1403), a D-frontier that has not been registered in the illegal D-frontier group is selected. However, there is no fault registered in the first time, so that FF3 is selected like in Step 1404 in FIG. 11. The D-frontier thus selected is temporarily stored (Step 1405). If the system fails in sensitizing the propagation path in the third time frame just like in the Related Art, the completion of the fault propagation process is checked (Step 111). When the process is not successful, the D-frontier 709 temporarily stored is registered to the illegal D-frontier group 1001 of the target fault 713 (Step 112).

After this, the foregoing process is executed for every unprocessed fault on the fault table (the process from Step 105 to either step 111 or to step 112 is repeated, wherein a D-frontier in No. k (=1st in this embodiment) time frame is registered as an illegal D-frontier for each fault for which the propagation process has been unsuccessful.

After the completion of the test sequence generation process for every unprocessed fault, it is judged that there is no unprocessed fault (Step 105). Accordingly, faults corresponding to "0" in the column of "process" and other than "1" in the column of "redundancy fault" is set to "0" in the column of "process" (Step 113), which allows faults for which the process has been unsuccessful to be selected again. The variable i representing the number of the test sequence generation process repeated so far is counted up by 1 (Step 114), and the system goes back to Step 105.

In a second (i=2) fault propagating process, the fault 713, for which the process has been unsuccessful when i=1, is reselected as a target fault (Step 106) and the process is executed as follows after the test pattern for the combinational circuit is generated (S107):

In the process in the time frame 701, which is the first time frame (Step 1403), the reference to the illegal D-frontier group 1001 enables FF3 to be eliminated from the selecting objects (709), and as a result, FF1 (707) is heuristically selected as a D-frontier (1404) and temporarily stored (Step 1405). This sensitizes the fault propagation path 002 up to the external output pin 704 (Step 1407) and makes FF1 (707) be the target PPO (Step 1408).

In a second time frame 702, FF3 (712) is selected as D-frontier (Steps 1403 and 1406) and a fault propagation path 1003 is sensitized (Step 1407) to propagate the effects of the fault to FF1 (707) of the target PPO, thereby FF3 (712) is made the target PPO (Step 1408).

In a third time frame 703, the fault site 713 is selected as a D-frontier (Steps 1403 and 1406) and a fault propagation path 1004 is sensitized (Step 1407) to propagate the effects of the fault from the fault site 713 to FF3 (712) of the target PPO. Since the target fault has been sensitized (Step 1402), the system proceeds to a state initialization process, which is not described because it is the same as that of the related art.

As explained hereinbefore, according to this embodiment, in the case that a fault propagation process is not successfully done in a test sequence Generated to test a target fault, a D-frontier selected in k(=1 in this embodiment) time frame, which propagates the effects of its target fault to external output pins, is registered to the illegal D-frontier group. Additionally, a test sequence not successfully Generated for a target fault is regenerated. Thus, a signal line belonging to the illegal D-frontier Group for the target fault can be eliminated from the selecting objects of a D-frontier in a time frame where the effects of the target fault are propagated to the external output pins when the test sequence is regenerated. Thus a fault propagation path is flexibly changed, thereby the chances of success in generating a test sequence for a target fault is increased. As a consequence, a test sequence for a target fault with high fault coverage can be produced.

Embodiment 2

Figure 13:
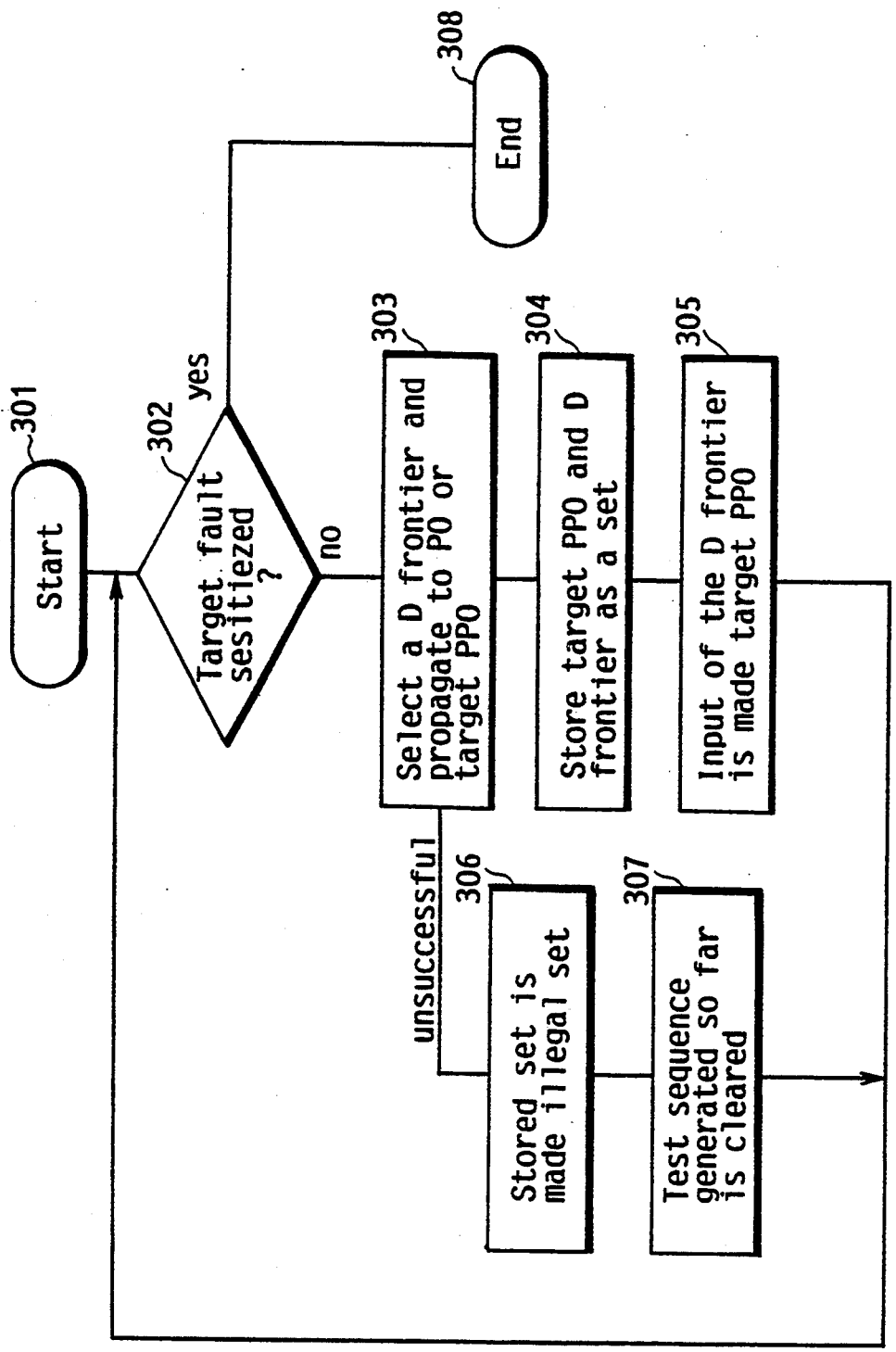
FIG. 13 is a flowchart of the fault propagation process in Embodiment 2 of this invention.

The test sequence generation method of this embodiment is flowcharted in FIG. 13 which is substantially the same as FIG. 2 for the related art except for the fault propagation process. Accordingly, the fault propagation process is exclusively described as follows:

In FIG. 13, the fault propagation process starts at Step 301. In Step 302, it is judged whether a target fault has been sensitized or not. If it has, then the system goes to Step 308 to terminate the process, and otherwise the system proceeds to Step 303. In Step 303, either the target fault or one of the outputs of the FFs is selected as a D-frontier. Then a test pattern, which propagates a fault signal to the target PPO, is generated. If this process is unsuccessful, then the system goes to Step 306, and otherwise it proceeds to Step 304. However, a set of a D-frontier that belongs to the illegal set group and the target PPO is eliminated from the selecting objects. In Step 304, the set of the target PPO and the D-frontier is temporarily stored.

In Step 305, if the D-frontier selected in Step 303 is the input of an FF whose output is made a new target PPO.

In Step 306, the set of the D-frontier selected in Step 304 and the target PPO is added to the illegal set group. An example of such illegal set group is shown in FIG. 14.

In Step 307, the test sequence produced so far is all cleared and the system goes back to Step 302.

In Step 308, the illegal set group is cleared and the fault propagation process terminates.

Figure 15:
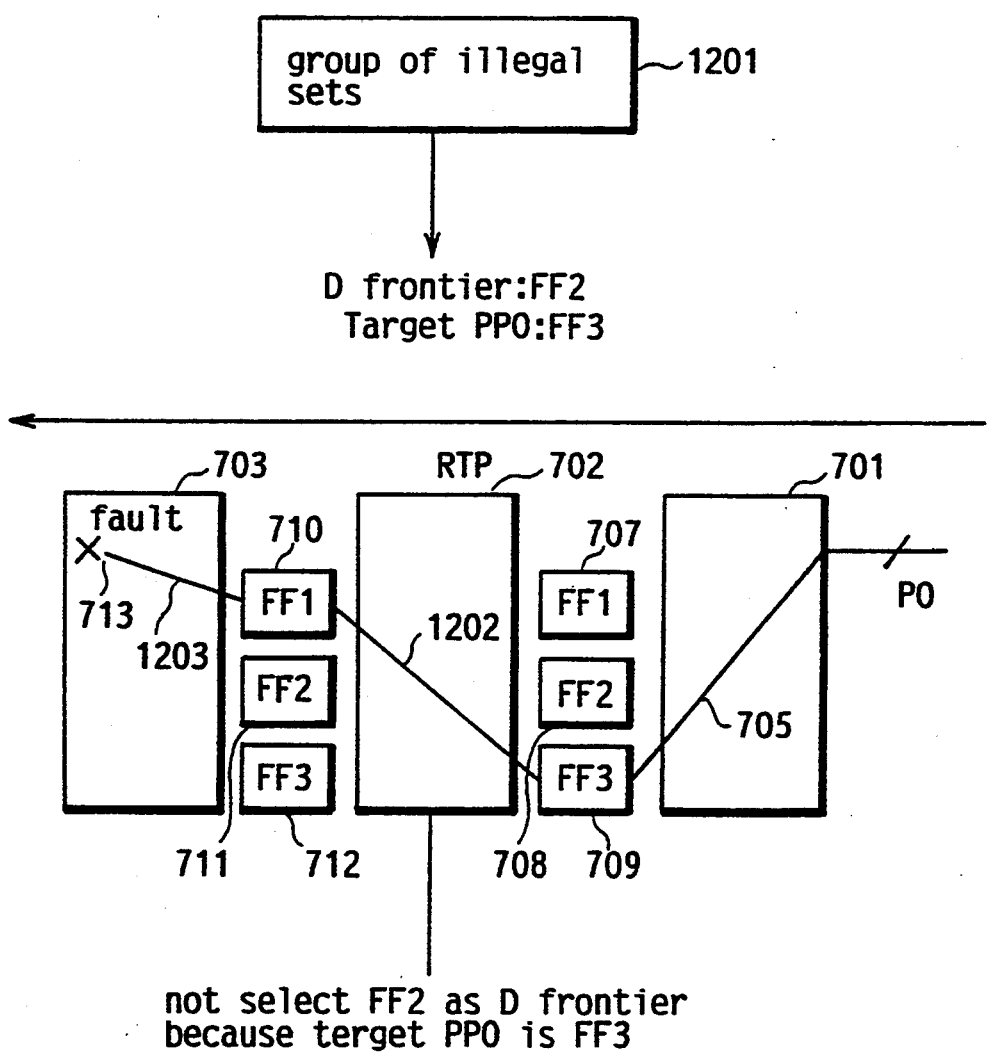
FIG. 15 is an operational illustration of the fault propagation process in the same embodiment.

The operation of the foregoing test sequence generation of this embodiment is described as follows with reference to FIG. 15 where like components are labeled with like reference numerals with respect to FIG. 6:

In FIG. 15, numeral 1201 represents the illegal set group shown in FIG. 14, and lines 1202 and 1203 are respectively fault propagation paths in the time frames 702 and 703 respectively.

In the test sequence generation for the target fault 713, if it is assumed that the fault propagation process in the time frame 703 is not successful as described before (Step 303 in FIG. 13), a set of a D-frontier that is the output of FF2 (711) in the time frame 702 immediately before the time frame 703 where the process is unsuccessful and a target PPO that is the input of FF3 (709) is registered to the illegal set group 1201 (Step 306).

Subsequently, the system goes back to the first time frame 701 to perform the process again after clearing all the sequence generated so far for the target fault 713 (Step 307), and selects the D-frontier 709 in the time frame 701. Then the fault propagation path 705 is sensitized to propagate the effects of the target fault "b" (713) to the external output pins (Steps 302 and 303), and temporarily stores the set of the D-frontier 709 and the external output pin PO (Step 304) indicating the fault propagating path 705, the input of an FF whose output is the D-frontier being made the next target PPO (Step 305).

In the time frame 702, as the result of the reference of elements (D-frontier 711 and target PPO 709) in the illegal set group 1201, it is found that the D-frontier 709 is the target PPO. Accordingly, FF2 (711) is eliminated from the selecting objects and FF1 (710) is selected as a D-frontier. And the fault propagation path 1202, which extends up to FF3 (709) of the target PPO, is sensitized (Steps 302–305).

Then, the fault propagation process is executed in the time frame 703 and the fault site 713 is selected as the D-frontier. The fault propagation path 1203 is sensitized to propagate the effects of the fault from the fault site 713 to FF1 (710) of the target PPO (Steps 302–305). Since the target fault has been thus sensitized, the system treats the fault propagation process as success and moves to the state initialization process (Step 302).

Although in Step 307 above, the test sequence produced so far is all cleared and the fault propagation process is restarted from the first time frame, it can be restarted from one frame ahead of the time frame where the process has been unsuccessful because the path in an immediately preceding time frame is prohibited to be processed.

As described hereinbefore, according to this embodiment, in the case that a fault propagation process has not been successfully done in a test sequence generated to test a target fault, a set of a D-frontier and a target PPO selected in a time frame immediately before the time frame where the process has been unsuccessful is registered to the illegal set group. Additionally, the test sequence so far generated is all or partially cleared and regenerated from the beginning or the middle. Thus, any set belonging to the illegal set group can be eliminated from the selecting objects of a D-frontier in a time frame. Thus a fault propagation path is flexibly changed, thereby the chances of success in generating a test sequence for a target fault is increased. As a consequence, a test sequence for a target fault with high fault coverage can be produced.

Embodiment 3

Figure 16:
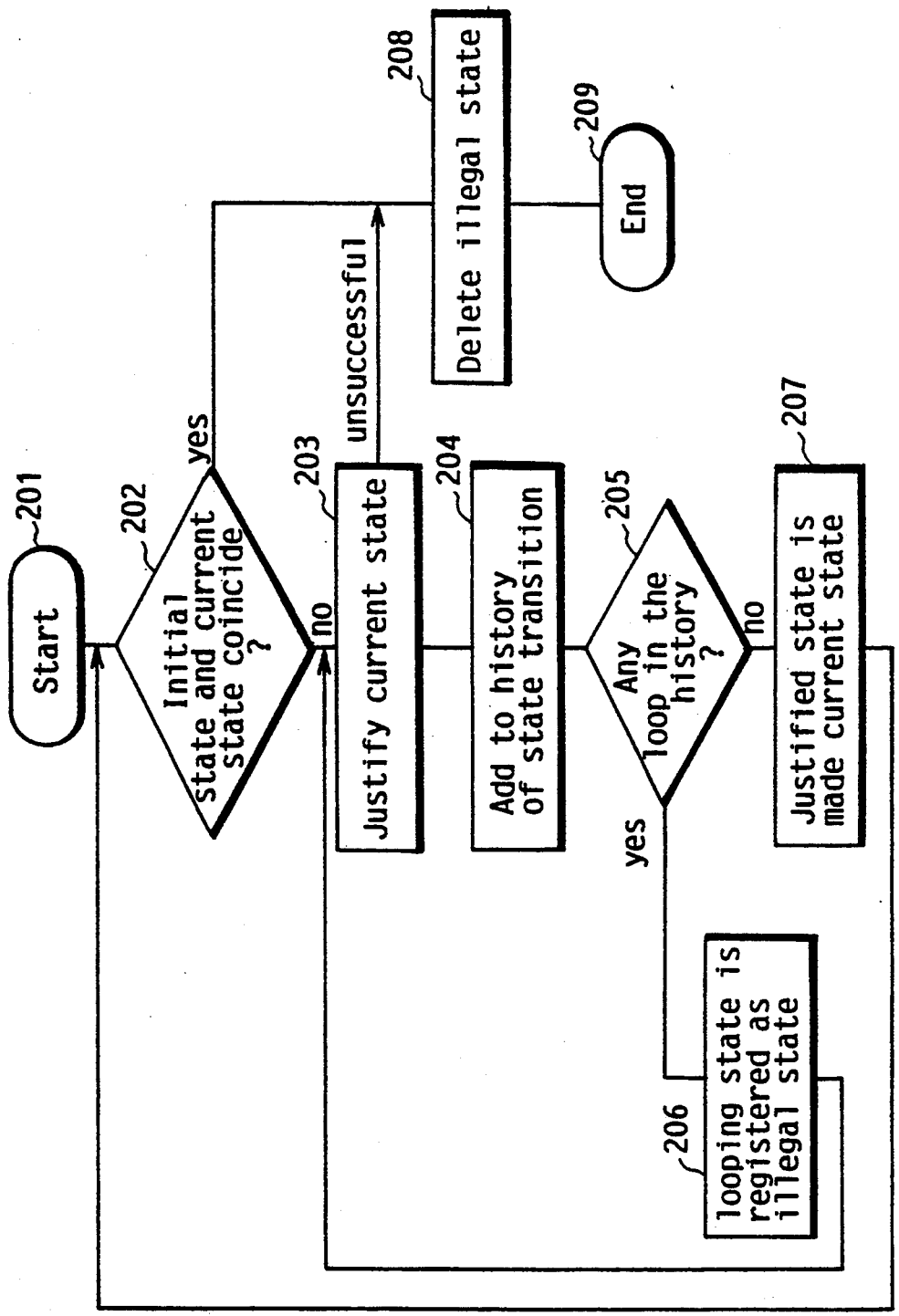
FIG. 16 is a flowchart of the state initialization process of Embodiment 3 of this invention.

The test sequence generation method of this embodiment is flowcharted in FIG. 16 which is substantially the same as FIG. 2 except for the state initialization process. Accordingly, the state initializing process is exclusively described as follows:

In FIG. 16, the state initialization process starts at Step 201.

In Step 202, it is judged whether the current state of the circuit coincides with its initial state or not. If they are coincident, then the system goes to Step 208, and otherwise the system proceeds to Step 203.

In Step 203, the current state is justified by assigning values to the external input pins and the FFs so as not to go into the state belonging to the illegal state group registered in Step 206.

In Step 204, the justified state is added to the history of state transitions. An example of such history is shown in FIG. 17 wherein each state can be represented by a state name and a state value of each FF composing the state.

In Step 205, it is judged whether there is more than one state justified in Step 203 in the history. If there is, then the system goes to Step 206, and otherwise the system goes to Step 207.

In Step 206, the justified state is deleted from the history and registered to the illegal state group. When there are two identical states in the history, which means that a loop of a state transition is formed. Therefore, the state justified later is defined as an illegal state, thereby preventing the state initialization process from going into a loop.

In Step 207, the justified state is treated as the current state.

In Step 208, the illegal state Group is deleted.

In Step 209, the state initialization process terminates.

Figure 8:
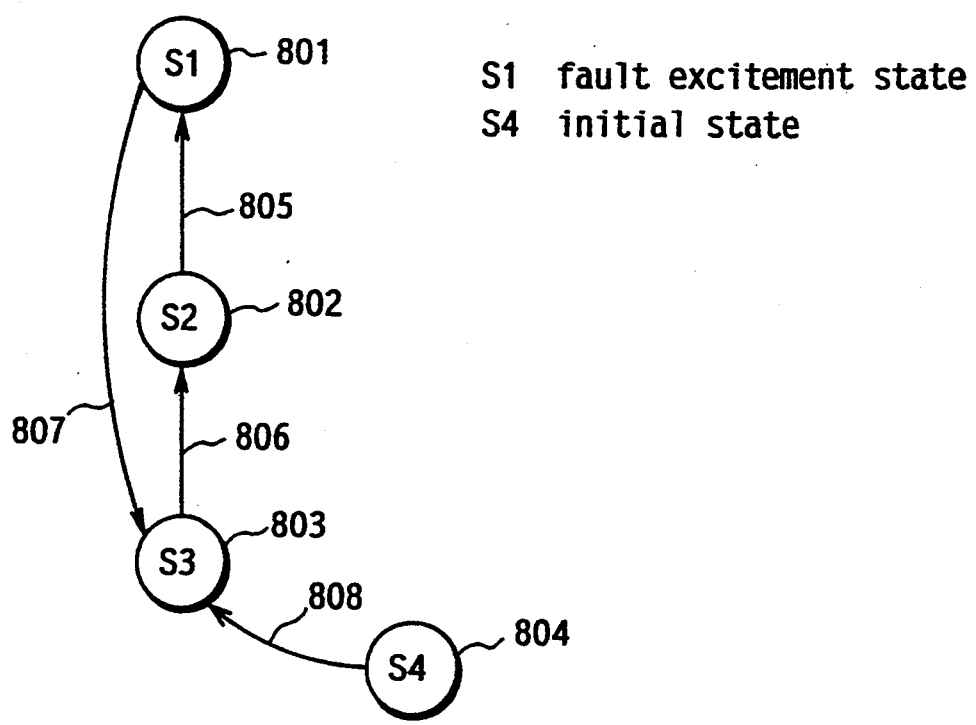
FIG. 8 is an example of state transitions in state initialization process.
Figure 18:
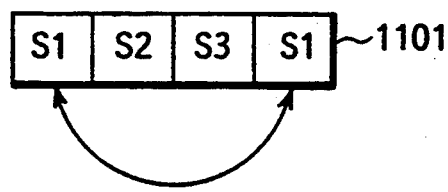
FIG. 18 is an operational illustration of the state initialization process in the same embodiment.
Figure 18:
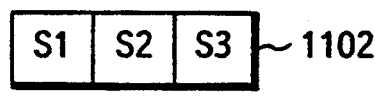
Figure 18:
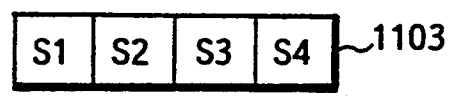

The operation of the test sequence Generation of this embodiment is described as follows with reference to FIG. 18:

FIG. 18 (a) shows a history 1101 of the state transitions in a case that there are two identical states during the state initialization process of a circuit to be tested having the state transitions shown in FIG. 8. FIG. 13(b) shows a history 102 in a case that of the two identical states, the later-assigned state has been deleted from the history 1101. FIG. 3(c) shows a history 1103 in a case that the state initialization process of the circuit is successfully performed.

The following is a description of the Generation of a test sequence transferring from the initial state 804 to the fault excitement state 801 in FIG. 8:

First, the fault excitement state 801 is registered to the history of the state transitions (Step 201). Then, the fault excitement state 801 is justified to obtain the state 802 (Step 203), which is registered to the history (Step 204). Since the state 802 is not the initial state, nor are there two identical states in the history (Step 205), the justified state is defined as the current state (Step 207) and the state 802 is justified (Steps 202 and 203). In the same manner, the states 803 and 801 are justified and registered to the history.

At this point, the history 1101 has two of the state 801 (Step 205, FIG. 18(a)), so that the state 801 registered later is deleted therefrom and registered to the illegal state group (Step 206 FIG. 18 (b)).

The state 804 is obtained by justifying the state 803 again to avoid to be in the illegal state 801 (Step 203), and is registered in the history (Step 204, FIG. 13(c)). Here, there is no identical states in the history 1103 (Step 205). Furthermore, since the state 804 equals to the initial state (Step 202), the state initiation process is successful and terminated.

According to this embodiment, the history of the state transitions is memorized when the state initialization process of the test sequence generation of a target fault is performed. When there are two identical states in the history, the state assigned later is deleted therefrom and registered as an illegal state so that it will not go to an illegal state. Thus the chances of success in a state initialization process is increased, and as a consequence, a test sequence for a target fault with high fault coverage can be produced.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A method for generating a test sequence to test an assumed stuck-at fault in a sequential circuit expanded as a series of time frames, comprising:

a first step of counting a number of fault propagation processes executed for every target fault, for which a test sequence is generated; and a second step of judging whether the number counted is beyond a predetermined number and then terminating the test sequence generation if the number counted is beyond the predetermined number wherein the first step comprises:

a first substep of selecting one target fault from either target faults for which the fault propagation processes have not been executed yet or other target faults for which the fault propagation processes are regarded to have not been executed yet, and for which test sequences have not been generated yet;

a second substep of, when a D-frontier indicating an input of a path to be sensitized is already registered as an illegal frontier, selecting a D-frontier other than the illegal frontier in a time frame where a target fault is propagated to an external output pin in order to execute a fault propagation process;

a third substep of judging whether the target fault propagation in the second substep is successful or not;

a fourth substep of, when the target fault propagation is judged to be unsuccessful, registering the D-frontier selected in a time frame where the effects of the target fault is propagated to an external output pin as an illegal D-frontier of the target fault; and a fifth substep of, when the first through third substeps have been executed for all the target faults, regarding target faults for which the fault propagation processes have been unsuccessfully executed as target faults for which fault propagation processes have not been executed yet.

2. A method for generating a test sequence to test an assumed stuck-at fault in a sequential circuit expanded as a series of time frames, comprising:

a first step of providing a fault propagation process to a target fault in one time frame;

a second step of storing a propagation path selected in a time frame immediately before a time frame being processed in the first step as a set of a signal line indicating the output of the propagation path (target pseudo-primary output) and a D-frontier indicating the input of the propagation path;

a third step of judging whether the fault propagation process in the first step is successful or not and executing the first step for the next time frame if it is successful, or otherwise registering a set of the target pseudo-primary output and the D-frontier stored in the second step as an illegal path;

a fourth step of, when the fault propagation process in the first step is unsuccessful, clearing from the test sequence at least a segment already generated on and after one frame ahead of the time frame where the fault propagation process is unsuccessful; and a fifth step of restarting the first step from the time frame corresponding to a segment cleared without selecting a set of the D-frontier and the target pseudo-primary output registered as an illegal path.

3. An apparatus for generating a test sequence to test an assumed stuck-at fault in a sequential circuit expanded as a series of time frames, comprising:

backtrace means for tracing backward in the series of time frames to propagate a fault signal of the stuck-at fault along a path selected in a time frame, wherein an input value in the time frame is assigned in order to sensitize the path and a backtrace operation, performed by the backtrace mean starts from a first time frame, which contains an output pin to be a goal of the stuck-at fault up to a time frame containing a fault site;

defining means for, when a given path unsuccessfully sensitized in a time frame is detected, defining at least a segment of the giver path as illegal information, the given path extending between the first time frame and the time frame where the given path is detected to have been unsuccessfully sensitized;

memory means for storing the illegal information correspondingly with the fault signal; and prohibiting means for prohibiting selection of a path defined as illegal information when the backtrace means is driven for another fault.

4. The apparatus of claim 3, wherein the illegal information is a D-frontier indicating a signal line selected in a specified time frame, the signal line being the goal of a fault signal propagated from an immediately preceding time frame.

5. The apparatus of claim 4, wherein the specified time frame is a first time frame in which a fault propagation path is sensitized first.

6. The apparatus of claim 3, wherein the illegal information is a set of a D-frontier and a target pseudo-primary output (PPO), the set indicating a propagation path in a specified time frame.

7. The apparatus of claim 3, wherein the illegal information is a set of a D-frontier and a target pseudo-primary output (PPO), the set indicating a propagation path in a time frame immediately before the time frame where the propagation has been unsuccessful.

8. An apparatus for generating a test sequence through a state initialization wherein input signal values to be inputted to external input pins of a sequential circuit to be tested are found in order to transfer a state of the circuit from its initial state to a state that appeared when a fault propagation process for a stuck-at fault has been just completed, comprising:

assigning means for, in order to justify a current state of the sequential circuit, assigning outputs of memory elements and input signal values to be given to the external input pins, the assignment being processed to obtain an initial state starting from a state that appeared when the fault propagation process has been just completed;

judging means for judging whether the justified state corresponding to the assignment coincides with either a state that appeared when the fault propagation process has been just completed or a state corresponding to an assignment made before the justified state is assigned; and restarting means for, when the two states are judged to be coincident with each other, restarting an assignment operation while cancelling at least the latest state of those states corresponding to assignments already made.

9. The apparatus of claim 8, wherein the restarting means starts an assignment operation from a state that appears when the fault propagation process has been just completed.

10. The apparatus of claim 8, wherein the restarting means starts an assignment operation from a state immediately before a coincident state.

11. A method for generating a test sequence to test an assumed stuck-at fault in a sequential circuit expanded as a series of time frames, comprising the steps of:

tracing backward in the series of time frames to propagate a fault signal of the stuck-at fault, the tracing occurring in each time frame along a path selected in each time frame and assigning an input value in each time frame in order to sensitize the path, at least one of the paths comprising a dominator-frontier (D-frontier) having a target fault site and a flip-flop that can propagate an effect of the target fault site to a target pseudo-primary output (PPO) located in an earlier time frame, the target PPO being an input of a flip-flop that is a D-frontier of the earlier time frame, the tracing-backward step starting from a first earlier time frame, which corresponds to an output pin to be a goal of the stuck-at fault up to a time frame corresponds to a target fault site;

defining, when a given path unsuccessfully sensitized in a time frame is detected, at least a segment of the given path including a D-frontier as illegal information, the given path extending between the first earlier time frame and the time frame where the given path is detected to have been unsuccessfully sensitized; and restarting another propagation of a fault signal from a D-frontier to a target PPO without selecting the segment of the given path defined as illegal information.

12. The method of claim 11, wherein the illegal information is a D-frontier indicating a signal line selected in a specified time frame, the signal line being the goal of a fault signal propagated from an immediately preceding time frame.

13. The method of claim 12, wherein the specified time frame is a time frame in which a fault propagation path is sensitized first.

14. The method of claim 11, wherein the illegal information is a set of a D-frontier and a target PPO, the set indicating a propagation path in a specified time frame.

15. The method of claim 11, wherein the illegal information is a set of a D-frontier and a target PPO, the set indicating a propagation path in a time frame immediately before the time frame where the propagation has been unsuccessfully sensitized.

* * * * *